(12) United States Patent
Bhansali et al.

(10) Patent No.: US 7,091,918 B1
(45) Date of Patent: Aug. 15, 2006

(54) RECTIFYING ANTENNA AND METHOD OF MANUFACTURE

(75) Inventors: Shekhar Bhansali, Tampa, FL (US);
Kenneth Buckle, Tampa, FL (US); D. Yogi Goswami, Gainesville, FL (US); Elias Stefanakos, Tampa, FL (US); Thomas Weller, Lutz, FL (US)

(73) Assignee: University of South Florida, Tampa, FL (US)

( * ) Notice: Subject to any disclaimer, the term of this patent is extended or adjusted under 35 U.S.C. 154(b) by 0 days.

(21) Appl. No.: 10/904,121

(22) Filed: Oct. 25, 2004

Related U.S. Application Data (60) Provisional application No. 60/514,327, filed on Oct. 24, 2003.

(51) Int. Cl.
*H01Q 13/10* (2006.01)
(52) U.S. Cl. .......... 343/767; 343/850; 343/860
(58) Field of Classification Search ........... 343/767, 343/850, 860
See application file for complete search history.

(56) References Cited

U.S. PATENT DOCUMENTS

| | | | |
|---|---|---|---|
| 3,760,257 A | 9/1973 | Fletcher et al. | |
| 3,989,994 A | 11/1976 | Brown | |
| 4,079,268 A | 3/1978 | Fletcher et al. | |
| 4,251,679 A | 2/1981 | Zwan | |
| 5,043,739 A * | 8/1991 | Logan et al. | 343/701 |
| 5,068,669 A * | 11/1991 | Koert et al. | 343/700 MS |
| 6,140,924 A * | 10/2000 | Chia et al. | 340/572.5 |
| 6,369,759 B1 | 4/2002 | Epp et al. | |

FOREIGN PATENT DOCUMENTS

WO 97/02623 * 1/1997

OTHER PUBLICATIONS

Hagerty et al., An Experimental and Theoretical Characterization of a Broadband Arbitrarily-Polarized Rectenna Array, IEEE MTT-S Digest, 2001, 1855-1858.
McSpadden et al., A High Conversion Efficiency 5.8 GHZ Rectenna, IEEE MTT-S Digest, 1997, 547-550.
McSpadden et al., Theoretical and Experimental Investigation of a Rectenna Element, IEEE Transactions on Microwave Theory and Techniques, 1992, 2359-2366, 40(12).
Suh et al., A Novel Dual Frequency Rectenna for High Efficiency Wireless Power Transmission at 2.45 and 5.8 GHZ, IEEE MTT-S Digest, 2002, 1297-1300.
Yoo et al., 35 GHZ Rectenna Implemented with A Patch and A Microstrip Dipole Antenna, IEEE MTT-S Digest, 1992, 345-348.

* cited by examiner

*Primary Examiner*—Trinh Vo Dinh
(74) *Attorney, Agent, or Firm*—Molly L. Sauter; Smith & Hopen, P.A.

(57) ABSTRACT

In accordance with the present invention, an aperture rectenna is provided where the substrate is transparent and of sufficient mechanical strength to support the fabricated structure above it. An aperture antenna is deposited on the transparent substrate and a metal-insulator-metal (MIM) diode is constructed on top of the aperture antenna. There is an insulating layer between the aperture antenna metal and the metal ground plane optimized to maximize the collection of incident radiation. The top of the structure is capped with a metal ground plane layer, which also serves as the DC connection points for each rectenna element.

36 Claims, 6 Drawing Sheets

RECTIFYING ANTENNA AND METHOD OF MANUFACTURE

CROSS REFERENCE TO RELATED APPLICATION

This application claims priority to Provisional U.S. Patent Application No. 60/514,327, "An Aperture Rectenna for Converting High Frequency Radiation into DC Power", by the same inventors, filed Oct. 24, 2003.

STATEMENT OF GOVERNMENT INTEREST

Research relating to the present application was supported by NASA/FSEC. Accordingly, the U.S. federal government may have rights in the present invention.

BACKGROUND OF THE INVENTION

Light energy is characterized by a dual nature both from a quantum point of view as photons and from a wave point of view as randomly polarized electromagnetic radiation with wavelengths from 400 nm to 700 nm. If the ultraviolet and infrared portion of the spectrum is included, the range of wavelengths is extended at both extremes. Presently all practical solar cell energy collection schemes use the photon nature of light in the explanation of operation. The conversion of solar energy to electrical energy using the photovoltaic effect depends on the interaction of photons with energy equal to or greater than the band-gap of the material. With continued research the maximum amount of energy captured using this mechanism is estimated to be around 30%. This is equivalent to an efficiency of 30%.

Another mechanism known in the art for converting solar energy to electrical energy is the rectenna. Rectenna technology relies on the electromagnetic nature of radiation and is not limited by the band-gap of the rectifying material. Advantages exist in the rectenna field because the rectenna approach is not fundamentally band-gap limited. Also, at microwave frequencies, 2.45 GHz, this concept has been demonstrated to be approximately 90% efficient.

Figure 1A:
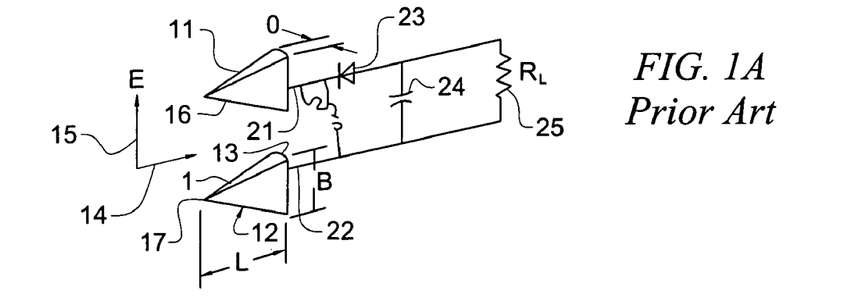
FIG. 1 is a prior art illustration of small cone type antennas with rectifiers mounted behind the cones and the cones arranged in an array.
Figure 1B:
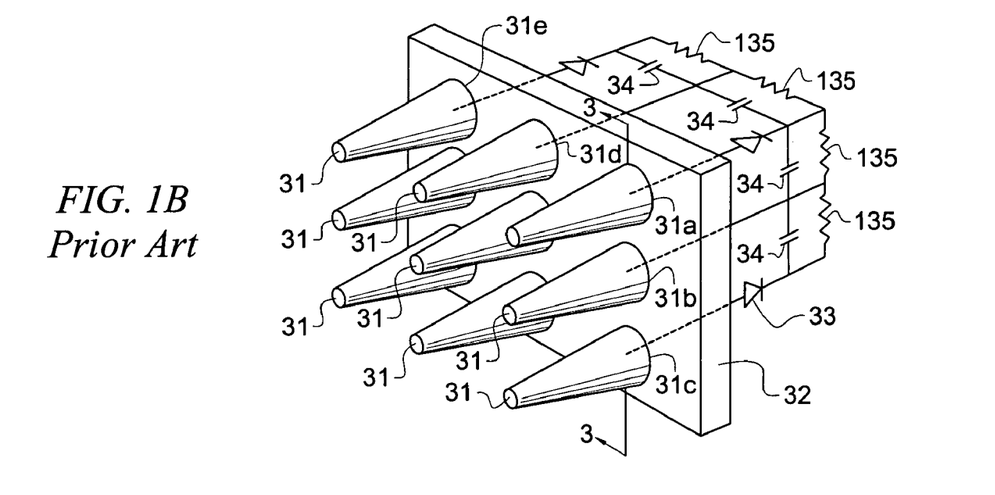
Figure 1C:
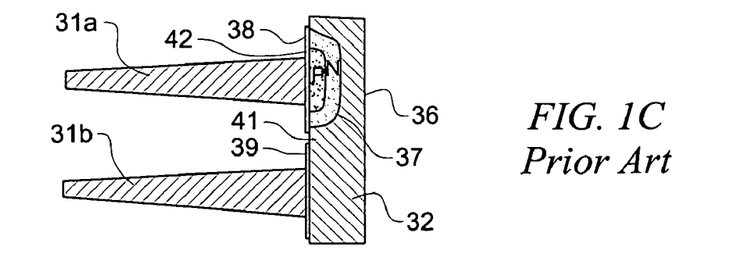

Prior art exists in the field of rectenna technology. The idea of direct electromagnetic conversion of solar energy has been explored as early as 1973. The concept envisioned small cone type antennas with rectifiers mounted behind the cones and the cones arranged in an array as illustrated in FIG. 1. The work preceded the revolution in micro and nano scale manufacturing and was never realized. Other more recent researchers have replaced the cones with planar antenna elements such as half-wave dipoles, bow tie, and spiral antennas.

The previous efforts in researching rectennas for solar energy conversion have concentrated on either building the rectifiers on a supporting substrate and then building the antennas on top of the rectifying layer, or fabricating the antenna structure and the rectifier on a planar surface. The fabrication processes known in the art for rectenna elements rely on hybrid systems that incorporate different technologies for each component of the rectenna to optimize the system performance. While the incorporation of hybrid technologies often allows for a shorter development time, compromises must be made to ensure that each component can be fabricated without damaging components already existing on the substrate.

By contrast, monolithic device fabrication allows for all components of a system to be constructed on a single substrate utilizing one technology. Monolithic devices are typically more compact than hybrid devices, and more reliable due to the reduction in interconnections required. Additionally, once the fabrication process for a monolithic device has been developed, they can be manufactured more efficiently since less assembly is required. Monolithic technology minimizes relatively long, high-resistivity connections and high loss metal interconnects.

Accordingly, what is needed in the art is a monolithic rectifying antenna providing high efficiency solar energy conversion with improved reliability and manufacturability.

However, in view of the prior art considered as a whole at the time the present invention was made, it was not obvious to those of ordinary skill in the pertinent art how the identified need could be fulfilled.

SUMMARY OF THE INVENTION

The longstanding but heretofore unfulfilled need for a monolithic rectifying antenna providing high efficiency solar energy conversion with improved reliability and manufacturability superior to rectifying antennas known in the art is now met by a new, useful, and nonobvious invention.

The present invention provides an integrated approach, at the nano-scale level, to fabricate a slot or aperture antenna integrated with a metal-insulator-metal (MIM) quantum tunneling diode to form a building block element in an array of rectenna elements for harvesting electromagnetic energy such as that emanating from the sun.

While many variations on the theme of an antenna coupled with a high frequency rectifier to harvest electromagnetic energy are known in the art, the present invention provides a novel and nonobvious solution to problems associated with prior art devices. In accordance with the present invention, an integrated nano-scale aperture antenna with a rectifier integrated using nano-scale monolithic processing is provided. Additionally, the rectifying antenna in accordance with the present invention lends itself to an inverted structure with the antenna deposited first on a transparent substrate and the rectifier and DC collection metallization fabricated on top of the antenna portion.

In accordance with the present invention is provided a rectifying antenna, comprising a transparent substrate layer, an aperture antenna fabricated on a surface of the transparent substrate, a rectifier having an anode and a cathode, the anode and the cathode electrically connected to the aperture antenna and separated from each other, the rectifier fabricated on top of the aperture antenna, a dielectric layer deposited to cover the aperture antenna and the rectifier, and a metal ground plane deposited over the dielectric layer, the metal ground plane being in electrical connectivity with the anode and the cathode of the rectifier.

While many materials may be used for the transparent substrate, in a particular embodiment the transparent substrate layer is glass.

The aperture antenna is fabricated is fabricated on the transparent substrate by depositing metal onto the surface of the transparent substrate and etching away the metal to form a slot and a dc break in the metal layer to reveal the transparent substrate, the slot and the dc break being contiguous. In a particular embodiment, the metal is gold, however other metals or metal alloys are within the scope of the present invention.

In a particular embodiment, the rectifying antenna includes an aperture or slot etched in the metal layer that is approximately $3\lambda/4$ in major length and approximately $\lambda/10$ in width, where $\lambda$ is the center wavelength of the radiation to be collected. The radiation to be collected may be emanating from the sun or another source of electromagnetic radiation as is known in the art.

The rectifying antenna in accordance with the present invention additionally includes, a dc break etched in the metal layer. In a particular embodiment, the dc break is etched to establish a slot through to the transparent substrate that is approximately $\lambda/4$ in major length.

To accommodate the positioning of the rectifier relative to the aperture antenna, the slot fabricated for the antenna further comprises a metal rectifier pad located approximately in the center of the slot and having a width of less than $\lambda/10$. This metal rectifier pad may be referred to as a conducting indentation and connectivity to one side of the rectifier as in the case of a metal-insulator-metal rectifier.

In a particular embodiment, the dielectric layer deposited to cover the antenna and the rectifier is fabricated to maximize the collection of radiation incident on the aperture antenna. In a particular embodiment, the dielectric layer is approximately $\lambda/4$ in thickness. In an additional embodiment, the dielectric layer is selected from the group consisting of ceramic, mica, glass, plastic and metal oxides.

While various rectifier elements are within the scope of the present invention, in accordance with a particular embodiment, the rectifier is a metal-insulator-metal (MIM) rectifier. As such, a first metal having a first potential and a second metal having a second potential are utilized in the fabrication of the MIM rectifier. In a particular embodiment, the first metal is platinum, the second metal is palladium, and the insulator of the MIM rectifier is selected from the group consisting of silicon dioxide, silicon nitride and aluminum oxide.

In accordance with an additional embodiment, the MIM rectifier may be replaced by a bolometer.

In an additional embodiment, a matching transmission line may be fabricated between the antenna and the rectifier to provide impedance matching. Additionally, a cooling mechanism may be employed in accordance with the present invention. The implementation of the cooling mechanism including, but not limited, to a liquid cooling channel positioned coincident with the ground plane or a silicon passive heat exchanger module.

To reduce the harmonics inherent in the rectifying antenna, it is within the scope of the invention to provide at least one notch filter positioned between the antenna and the rectifier in an effort to reduce unwanted harmonics.

In providing a rectifying antenna in accordance with the present invention, a method may be employed including the steps of, providing a transparent substrate layer, fabricating an aperture antenna on a surface of the transparent substrate, fabricating a rectifier on the surface of the aperture antenna, the rectifier having an anode and a cathode, the anode and the cathode electrically connected to the aperture antenna and separated from each other, depositing a dielectric layer to cover the aperture antenna and the rectifier and depositing a metal ground plane over the dielectric layer, the metal ground plane being in electrical connectivity with the anode and the cathode of the rectifier.

While various method are known in the art for the fabrication of elements on substrate materials, in a particular embodiment of the present invention the step of fabricating an aperture antenna on a surface of the transparent substrate further includes, depositing a first metal on the surface of the transparent substrate layer, etching away the deposited first metal to form a slot for the aperture antenna and a dc break.

In a particular embodiment, the rectifier element is a metal-insulator-metal rectifier. The method of fabricating the MIM rectifier further includes, forming a conducting indentation in the center of the antenna slot, the conducting indentation fabricated of a first metal and establishing the anode of the rectifier, depositing a dielectric layer on top of the conducting indentation and fabricating a second metal layer on top of the dielectric layer to form the metal-insulator-metal rectifier across the aperture antenna. In a preferred embodiment, the dielectric layer of the MIM rectifier is between approximately 1.5 nm and 2 nm and the second metal layer is deposited to a thickness of approximately 50 nm. These dimensions are intended to be exemplary and other thicknesses of the dielectric and the second metal layer are considered within the scope of the invention.

In an additional embodiment, a dielectric layer to cover the aperture antenna and the rectifier further is deposited and planarized to form a dielectric layer of substantially uniform thickness of $\lambda/4$, while other thicknesses are within the scope of the invention.

In accordance with the present invention, a plurality of rectifying antennas formed in accordance with the method as described may be connected to form an array of rectifying antennas.

As such, the present invention provides a monolithic rectifying antenna exhibiting high efficiency solar energy conversion with improved reliability and manufacturability.

With the present invention, the dc current travels in the z-direction thereby eliminating many lossy electrical connections due to additional metal interconnects, thereby improving reliability. The manufacturing of the device requires a minimal investment in nanotechnology manufacturing techniques.

Additionally, the delicate structures of the device are protected by the glass substrate.

Other aspects and advantages of the present invention can be seen upon review of the figures, the detailed description, and the claims, which follow.

BRIEF DESCRIPTION OF THE DRAWINGS

For a fuller understanding of the nature and objects of the invention, reference should be made to the following detailed description, taken in connection with the accompanying drawings, in which.

DETAILED DESCRIPTION OF THE PREFERRED EMBODIMENT

The method in accordance with the present invention establishes a fabrication process to provide a smooth, strong surface to build an aperture antenna on and thus allow the construction of the rectifier on top of the antenna to minimize relatively long, high-resistivity and high loss metal interconnects. In a particular embodiment, a $3\lambda/4$ slot antenna concept described by the present invention has been exemplified. Additional slot antenna dimensions are within the scope of the present invention.

The method in accordance with the present invention allows for the easy adaptation of dissimilar two metal metal-insulator-metal (MIM) rectifiers. In a particular embodiment, the MIM is build utilizing two metals exhibiting large differences in potential such as Pt or Pd combined with Au or W or Al. The structure requires a dielectric substance, such as $SiO_2$, Silicon Nitride or Aluminum Oxide. Other insulating materials are within the scope of the present invention.

Figure 2:
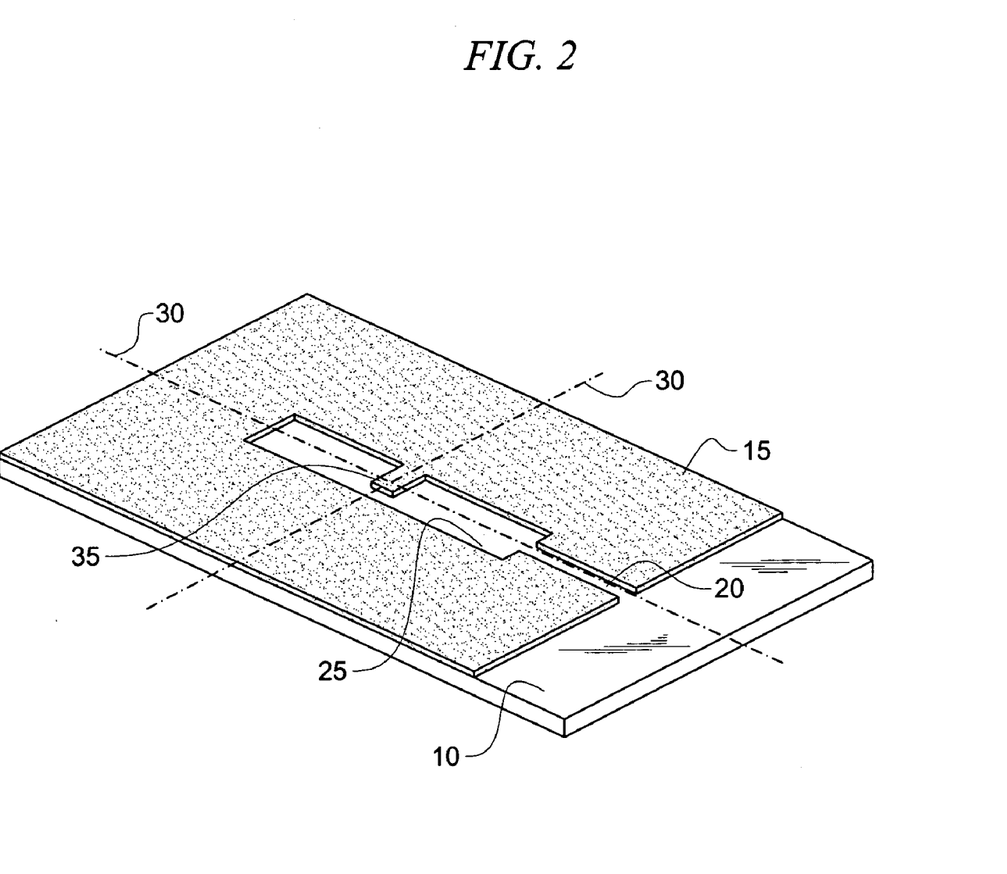
FIG. 2 is an illustration of a first metal layer on top of a substrate in accordance with the present invention.

With reference to FIG. 2, a rectifying antenna and method of manufacturing the same is provided wherein the construction of a slot rectenna includes the steps of, selecting a suitable transparent substrate 10, like glass, on which to build the structure, depositing a metal 15, like gold, and then etching away the slot 25 and dc break 20 as illustrated. The imaginary centerline 30 is also illustrated.

In a particular embodiment, the slot etched in the first metal (metal #1) layer opens a hole down to the transparent substrate, which is approximately $3\lambda/4$ in major length and approximately $\lambda/10$ in width. Where $\lambda$ is the center wavelength of the radiation to be collected and corrected for dilation due to the permitivity of the substrate. With reference to FIG. 2, the conducting indentation 35 in the center of the slot, will become one side of the MIM rectifier and the thin $\lambda/4$ slot extension on the right 20, will become the ac capacitive short/dc break for the structure. The ac capacitive short acts as a filter to separate the ac and dc components of the received signal.

Figure 3:
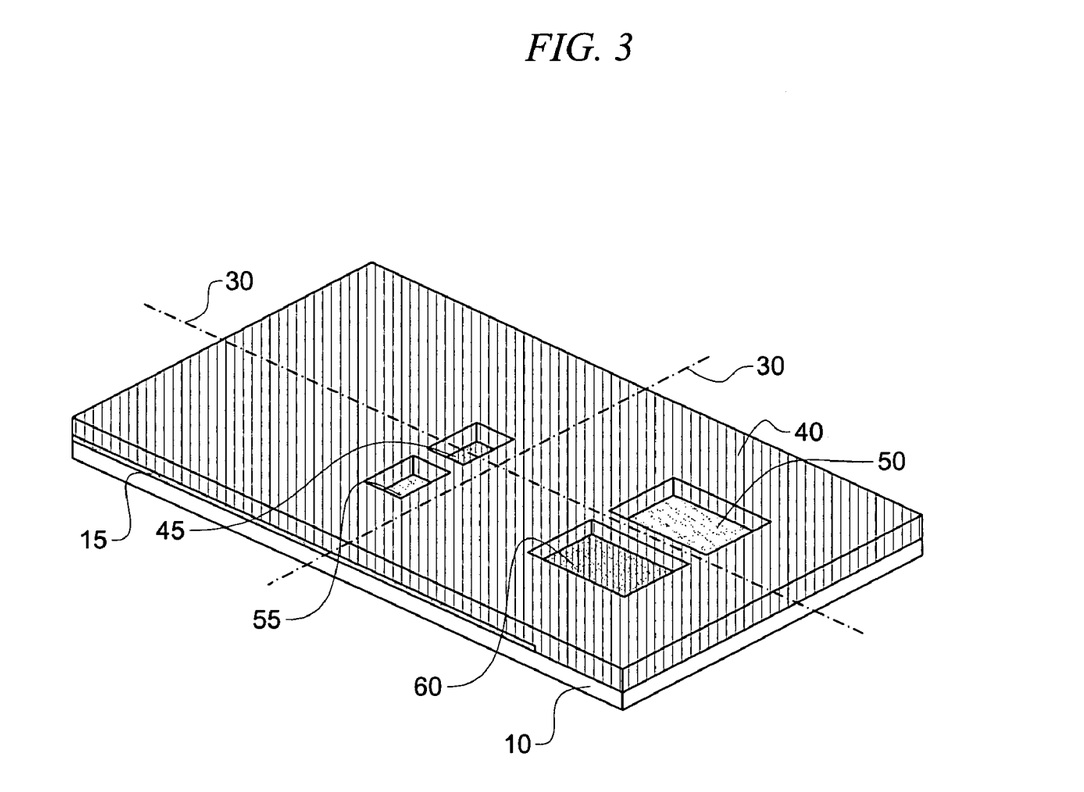
FIG. 3 is an illustration of a dielectric layer with windows to a first metal (metal #1) in accordance with the present invention.

After the slot 25 is etched in the metal layer, a dielectric layer 40 $\lambda/4$ thick is deposited over the entire first metal layer 15. Holes are opened in the dielectric layer to facilitate the second metal (metal #2) deposition. This is illustrated in FIG. 3 where the dielectric layer 40 has been deposited and holes 45, 50, 55 and 60 have been opened up to the metal #1 layer below.

In the process of opening the dielectric layer 40 certain areas such as the little pad 45 where the rectifier is to be constructed and one side of the ac capacitive short 60 must still have a thin layer of insulation 40. For the rectifier pad 45 this layer should be between 1.5 nm and 2 nm and for the capacitive short 60 the insulation should be thicker than 10 nm.

Figure 4:
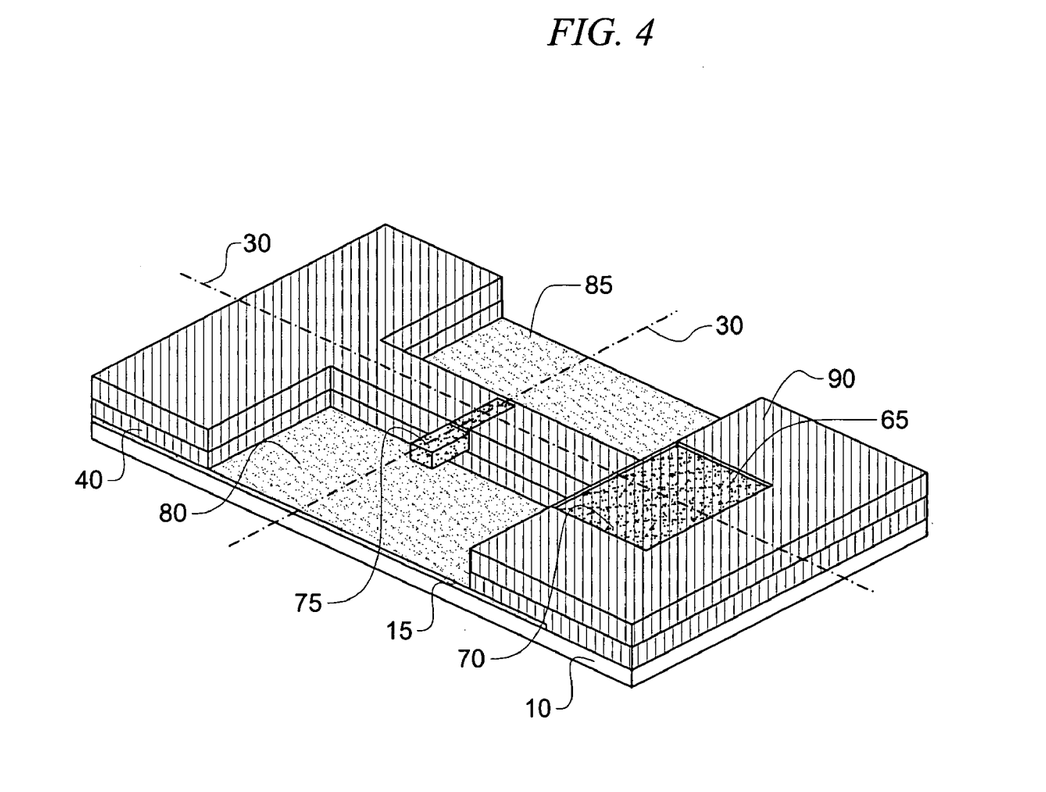
FIG. 4 is an illustration of a structure with a second metal (metal #2) in place and DC vias in accordance with the present invention.

At this point in the fabrication process, the second metal layer 65 is deposited. The second metal layer 65 is approximately 50 nm thick. After the second metal layer 65 is deposited it is etched away from areas where it is not wanted, as shown in FIG. 4. As such, the metal-insulator-metal rectifier 75 is formed. Above metal #2 (second metal) the insulation layer is replaced and planarized 90 so it is a uniform layer of thickness $\lambda/4$ then the window for the two dc vias, 80 and 85, are opened up.

Figure 5:
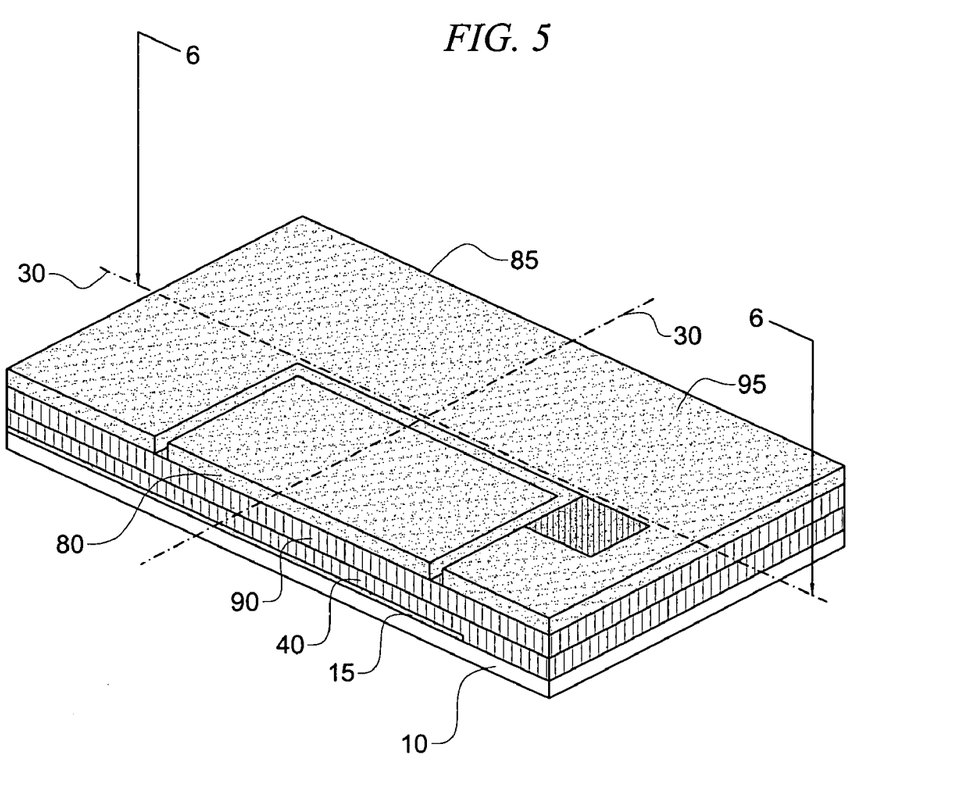
FIG. 5 is an illustration of a top metal ground plane and DC connections in accordance with the present invention.

A final layer of the same material as metal #1 is then deposited to form a ground plane 95 and provide connection points to the +via 85 and –via 80 as illustrated in FIG. 5.

If the rectifying antennas were incorporated into an array, the top layer of the system would include interconnection of the individual rectenna elements so energy could be effectively captured on a macroscopic scale.

Figure 6:
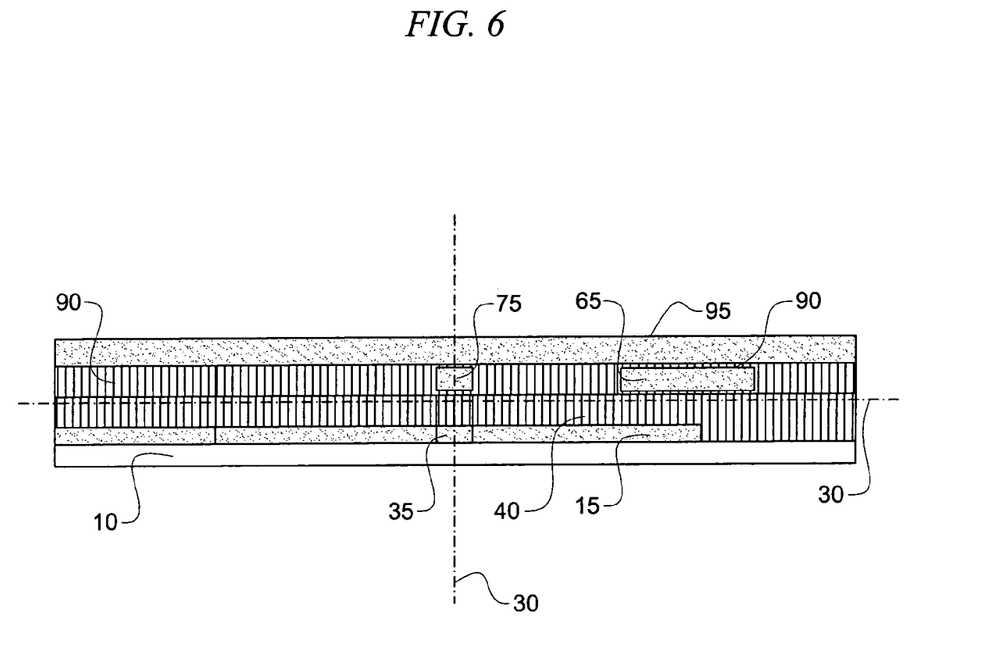
FIG. 6 is an illustrated cross sectional edge view of a rectifying antenna, or rectenna, in accordance with the present invention.

With reference to FIG. 6, an edge sectional view taken through the centerline 30 of the slot is shown.

In accordance with the present invention, the MIM can be constructed of a large variety of conducting metal combinations, the insulation can be inorganic as has been described or organic and can be made of many different types of materials. The shape of the slot and the diode may be varied. Due to impedance matching concerns between the antenna and the rectifier the dimensions of the slot may vary and it may be necessary to incorporate a matching transmission line between the antenna and the rectifier. Optional cooling methods may be employed such as liquid cooling channels next to the metal layer or a silicon passive heat exchanger module.

The non-linear nature of the rectifier causes the generation of harmonics. To prevent the loss of efficiency associated with the re-radiation at higher harmonics it is within the scope of the present invention to incorporate notch filters between the antenna and the rectifier.

Additionally, the array of slot rectennas could be replaced with an array of monopole traveling wave antennas manufactured using carbon nano-tube technology. The nano-tube antennas would be several wavelengths long and have a MIM built into their base.

In another embodiment of the invention, replaces the slot antenna with either a slot parasitic array antenna or a dipole parasitic array antenna. The use of the array concept maintains the high collection density, and handles the polarization problem to reduce the number of MIM structures required for energy conversion.

It will be seen that the objects set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween. Now that the invention has been described,

What is claimed is:

1. A rectifying antenna, comprising:
a transparent substrate layer;
an aperture antenna fabricated on a surface of the transparent substrate;
a rectifier having an anode and a cathode, the anode and the cathode electrically connected to the aperture antenna and separated from each other, the rectifier fabricated on top of the aperture antenna;
a dielectric layer deposited to cover the aperture antenna and the rectifier; and
a metal ground plane deposited over the dielectric layer, the metal ground plane being in electrical connectivity with the anode and the cathode of the rectifier.

2. The rectifying antenna of claim 1, wherein the transparent substrate layer is glass.

3. The rectifying antenna of claim 1, wherein the aperture antenna is fabricated of a metal.

4. The rectifying antenna of claim 3, wherein the metal is gold.

5. The rectifying antenna of claim 1, wherein the aperture antenna is fabricated by depositing metal onto the surface of the transparent substrate and etching away the metal to form a slot and a dc break in the metal layer to reveal the transparent substrate, the slot and the dc break being contiguous.

6. The rectifying antenna of claim 1, wherein the slot etched in the metal layer is approximately $3\lambda/4$ in major length and approximately λ/10 in width, where λ is the center wavelength of the radiation to be collected.

7. The rectifying antenna of claim 5, wherein the dc break etched in the metal layer is approximately λ/4 in major length.

8. The rectifying antenna of claim 5, wherein the slot further comprises a metal rectifier pad located approximately in the center of the slot and having a width of less than λ/10.

9. The rectifying antenna of claim 1, wherein the dielectric layer is fabricated to maximize the collection of radiation incident on the aperture antenna.

10. The rectifying antenna of claim 1, wherein the dielectric layer is approximately λ/4 in thickness.

11. The rectifying antenna of claim 1, wherein the dielectric layer is selected from the group consisting of ceramic, mica, glass, plastic and metal oxides.

12. The rectifying antenna of claim 1, wherein the rectifier is a metal-insulator-metal rectifier.

13. The rectifying antenna of claim 12, wherein the metal-insulator-metal rectifier is fabricated using a first metal having a first potential and a second metal having a second potential.

14. The rectifying antenna of claim 13, wherein the first metal is platinum.

15. The rectifying antenna of claim 13, wherein the second metal is palladium.

16. The rectifying antenna of claim 12, wherein the insulator of the metal-insulator-metal rectifier is selected from the group consisting of silicon dioxide, silicon nitride and aluminum oxide.

17. The rectifying antenna of claim 1, wherein the rectifier is a bolometer.

18. The rectifying antenna of claim 1, further comprising a matching transmission line fabricated between the antenna and the rectifier to provide impedance matching.

19. The rectifying antenna of claim 1, further comprising a cooling mechanism.

20. The rectifying antenna of claim 19, wherein the cooling mechanism is a liquid cooling channel positioned coincident with the ground plane.

21. The rectifying antenna of claim 19, wherein the cooling mechanism is a silicon passive heat exchanger module.

22. The rectifying antenna of claim 1, further comprising at least one notch filter positioned between the antenna and the rectifier to reduce harmonics.

23. A method of fabricating a rectifying antenna, the method comprising the steps of:
providing a transparent substrate layer;
fabricating an aperture antenna on a surface of the transparent substrate;
fabricating a rectifier on the surface of the aperture antenna, the rectifier having an anode and a cathode, the anode and the cathode electrically connected to the aperture antenna and separated from each other;
depositing a dielectric layer to cover the aperture antenna and the rectifier; and
depositing a metal ground plane over the dielectric layer, the metal ground plane being in electrical connectivity with the anode and the cathode of the rectifier.

24. The method of claim 1, wherein the step of fabricating an aperture antenna on a surface of the transparent substrate further comprises:
depositing a first metal on the surface of the transparent substrate layer; and
etching away the deposited first metal to form a slot for the aperture antenna and a dc break.

25. The method of claim 24, wherein the step of etching the deposited first metal further comprises:
etching away the deposited first metal to form a slot approximately 3λ/4 in major length and approximately λ/10 in width, where λ is the center wavelength of the radiation to be collected; and
etching away the deposited first metal to form a dc break approximately λ/4 in major length.

26. The method of claim 23, wherein the step of fabricating a rectifier on the surface of the aperture antenna, the rectifier having an anode and a cathode, the anode and the cathode electrically connected to the aperture antenna and separated from each other, further comprises, fabricating a metal-insulator-metal rectifier.

27. The method of claim 26, wherein the step of fabricating a metal-insulator-metal rectifier further comprises:
forming a conducting indentation in the center of the antenna slot, the conducting indentation fabricated of a first metal thereby forming the anode of the rectifier;
depositing a dielectric layer on top of the conducting indentation;
fabricating a second metal layer on top of the dielectric layer to form the cathode of the rectifier, thus forming a metal-insulator-metal rectifier across the aperture antenna.

28. The method of claim 27, wherein the step of depositing a dielectric layer on top of the conducting indentation further comprises, depositing a dielectric layer between approximately 1.5 nm and 2 nm in thickness.

29. The method of claim 27, wherein the step of fabricating a second metal layer further comprises fabricating a second metal layer approximately 50 nm in thickness.

30. The method of claim 23, wherein the step of depositing a dielectric layer to cover the aperture antenna and the rectifier further comprises, depositing a dielectric layer approximately λ/4 in thickness.

31. The method of claim 23, wherein the step of depositing a dielectric layer to cover the aperture antenna and the rectifier further comprise planarizing the dielectric layer to form a dielectric layer of substantially uniform thickness of λ/4.

32. The method of claim 23, further comprising connecting a plurality of rectifying antennas to form an array of rectifying antennas.

33. The method of claim 23, further comprising fabricating a matching transmission line between the antenna and the rectifier to improve impedance matching.

34. The method of claim 23, further comprising fabricating cooling channels coincident with the first metal layer.

35. The method of claim 23, further comprising fabricating a silicon passive heat exchanger module coincident with the substrate layer.

36. The method of claim 23, further comprising fabricating at least one notch filter between the antenna and the rectifier to reduce harmonics.

* * * * *